United States Patent [19]
Boucher

[11] Patent Number: 5,963,067
[45] Date of Patent: Oct. 5, 1999

[54] REVERSE CURRENT THROTTLING OF A MOS TRANSISTOR

[75] Inventor: Richard Edward Boucher, Santa Clara, Calif.

[73] Assignee: Maxim Integrated Products, Inc., Sunnyvale, Calif.

[21] Appl. No.: 09/012,516

[22] Filed: Jan. 23, 1998

[51] Int. Cl.$^6$ ............................ G05F 1/10; H03K 19/0185
[52] U.S. Cl. ............................ 327/112; 327/333; 326/27; 326/83
[58] Field of Search ...................................... 327/108, 109, 327/112, 389, 391, 333, 538, 543, 427, 434, 436, 437; 326/23, 24, 26, 27, 82, 83

[56] References Cited

U.S. PATENT DOCUMENTS

| | | | |
|---|---|---|---|
| 5,414,314 | 5/1995 | Thurber, Jr. ............................ | 327/427 |
| 5,530,394 | 6/1996 | Blossfeld et al. ...................... | 327/530 |
| 5,606,281 | 2/1997 | Gloaguen ................................ | 330/51 |
| 5,821,808 | 10/1998 | Fujima ................................... | 327/541 |

FOREIGN PATENT DOCUMENTS

WO 95/08219  3/1995  WIPO .

*Primary Examiner*—Tuan T. Lam
*Attorney, Agent, or Firm*—Blakely, Sokoloff, Taylor & Zafman LLP

[57] ABSTRACT

The invention is a means for ensuring full current flow in the "forward" direction in a MOS transistor, and substantially reducing (and/or eliminating) current flow in the "reverse" direction. The forward voltage drop and reverse current are controllable and are determined by ratios of device size. In one embodiment, the present invention is a circuit coupled to an output stage transistor having an output voltage thereon to ensure current flow in one direction and to throttle current flow in a reverse direction. The circuit includes a first circuit coupled to the output transistor to progressively turn off the same as the output voltage reaches a first threshold voltage and approaches a rail voltage. The circuit further includes a second circuit coupled to the output transistor to turn off the same as the output voltage reaches a second threshold voltage where the second threshold voltage is greater than the rail voltage.

31 Claims, 3 Drawing Sheets

REVERSE CURRENT THROTTLING OF A MOS TRANSISTOR

BACKGROUND OF THE INVENTION

1. Field of the Invention

The present invention relates generally to interface circuits, and specifically, to a circuit for allowing full forward current and throttling reverse current in an output stage MOS transistor.

2. Background Information

A metal oxide semiconductor ("MOS") transistor is a bilateral device. When the MOS transistor is on, current may flow in either direction depending on the ON resistance and the differential voltage across the device. In specific applications, such as a CMOS driver connected to a multi-party line, it is desirable for current to flow freely in one direction, and to be greatly restricted in the opposing direction. In a transmitter driver application for a three volt interface circuit, there are the combined requirements for high forward drive currents (e.g., greater than 10 mA) at a low Vds (e.g., 0.2 Volts) and a very low (or zero) reverse current. Forward current is defined as a positive current flowing from the positive supply (VCC) through the MOS device to the output or from the output through the MOS device into the negative supply (VEE or GND). Except for the forward voltage drop across a diode (Vbe), the diode (p-n junction) exhibits the required circuit function.

An active rectification circuit can provide the required function but there are accuracy and hysteresis problems in determining when the MOS transistor should and should not conduct. For example, in the transmitter driver application where the driver is attached to a multi-party line, the MOS transistor must be able to protect against the potential for reverse current which may be caused by an external circuit pulling the output beyond the supply rails, by noise, or by ringing due to improper line termination. If the MOS transistor turns off at an output voltage beyond the supply rail, significant reverse current may flow, depending on the MOS transistor ON resistance, until the turn off voltage is reached.

In the case of a power supply with a high output resistance (as with a battery) the reverse current may result in back-charging the supply, which can be destructive to a non-rechargeable battery. The MOS device must also behave properly when nothing external is driving the output, and there is only an external load with resistance ranging from a short circuit up to and including an open circuit. If the MOS transistor turns completely off prior to the output reaching the supply rail voltage, an external load can cause the output to droop. It will continue to droop due to the external load until the MOS device again turns on. The difference in the output voltage from turn off to turn on is the hysteresis of the active rectification circuit. When the MOS transistor is turned off prior to the output reaching the supply voltage, the output will "chatter", oscillating between turn off and turn on voltages.

FIG. 1 illustrates a prior art output interface circuit. Referring to FIG. 1, four series connected MOS transistors MP1, MP2, MN2 and MN1 are shown. This represents a low voltage MOS transmitter driver as shown in U.S. Pat. No. 5,414,314 issued to Thurber and assigned to the assignee of the present invention. Under normal transmitter enabled conditions, MP1 and MN1 remain fully-on, and MP2 and MN2 are switched in such a way that MP2 or MN2 is on to drive VOUT high or low, respectively, but both are never on together.

The addition of MP1 and MN1 to the elementary switching circuit provides a means for active rectification. The incentive for the addition of MP1 and MN1 in lieu of diodes is to eliminate the forward Vbe of the diodes. The forward Vbe is typically greater than 0.8 Volts at temperature. This voltage is replaced by the Vds (drain-to-source voltage) of a MOS device, which is a size/strength dependent variable, but typically sized to never exceed 0.3 Volts.

FIG. 2 illustrates a cross section of the prior art output interface circuit. For purposes of illustration, FIG. 2 shows a P-well process with isolated pockets on a p-type substrate. However, the output interface circuit may equally be built in an n-well process. Referring to FIGS. 1 and 2, PMOS devices MP1 and MP2 are isolated in a local n- pocket 10. The potential of the n- pocket 10 is that of Node P1 and is maintained by the voltage on the common sources 14 and 16 of MP1 and MP2, when either or both of MP1 and MP2 are on, in parallel with the p+(12)/n-(10) diode DP1 and the P+(18)/n-(10) diode DP2. These diodes are called "body diodes" and are present by virtue of the semiconductor materials which create the MOS devices. Moreover, NMOS devices MN1 and MN2 are isolated in a second local n-pocket 20. The potential of this pocket is held at VCC. Within the second n- pocket (20) is a P-well (p-) 30 where the NMOS devices are contained. The potential of the P-well 30 is that of the Node W1 and is maintained by the voltage on the common sources 26 and 24 of MN1 and MN2, when either or both of these devices are on, in parallel with the p-(30)/n+(28) body diode DN1 and the p-(30)/n+(22) body diode DN2.

Referring back to FIG. 1, voltage sensitive detection circuitry is constantly monitoring VOUT relative to VCC and GND. In the case of active rectification, when VOUT is determined to be at or above VCC, gate GP1 is connected to Node P1 which turns off MP1. A small current flows from VOUT through MP2, if ON, or through DP2 if MP2 is OFF, which will charge up Node P1 to the VOUT voltage level. Once charged up to VOUT, no more current will flow.

A complementary action takes place on the NMOS side of the circuit when VOUT is determined to be at or below GND. In this instance, gate GN1 is connected to Node W1. This turns off MN1. A small current flows from W1 through MN2, if ON, or through DN2 if MN2 is OFF, to discharge W1 to the VOUT voltage level.

The embodiment shown in FIGS. 1 and 2 suffers from the real world inaccuracies as described above. Namely, the actual measurement of VOUT includes typical offset errors. To avoid the "chatter" problem described above, the measurement must be biased to delay the turn off point until VOUT exceeds VCC (or GND) by at least the worst case offset. Once VOUT exceeds VCC (or GND), reverse current can flow. At the point at which the state of the output is switched, significant reverse current may flow, and in the case of a high impedance supply, the VCC (or GND) may be pulled with VOUT and "turn off" may never occur.

SUMMARY OF THE INVENTION

The invention is a means for ensuring full current flow in the "forward" direction in a MOS transistor, and substantially reducing (and/or eliminating) current flow in the "reverse" direction. The forward voltage drop and reverse current are controllable and are determined by ratios of device size. In one embodiment, the present invention is a circuit coupled to an output stage transistor having an output voltage thereon to ensure current flow in one direction and to throttle current flow in a reverse direction. The circuit includes a first circuit coupled to the output transistor to progressively turn off the same as the output voltage reaches a first threshold voltage and approaches a rail voltage. The circuit further includes a second circuit coupled to the output transistor to turn off the same as the output voltage reaches a second threshold voltage where the second threshold voltage is greater than the rail voltage.

BRIEF DESCRIPTION OF THE DRAWINGS

The features and advantages of the present invention will become apparent from the following detailed description of the present invention in which.

DESCRIPTION OF THE PREFERRED EMBODIMENT

In the following description, for purposes of explanation, numerous details are set forth in order to provide a thorough understanding of the present invention. However, it will be apparent to one skilled in the art that these specific details are not required in order to practice the present invention.

With the present invention, when operating in the positive current mode with the driver output voltage well below the supply voltage, the MOS transistor is fully-on. When the driver output voltage is at a first threshold near the supply voltage, the MOS transistor begins to progressively turn off such that the electrical resistance of the device increases in inverse proportion to the driver output voltage from the supply rail. When the driver output is at the same voltage as the supply rail, the resistance of the MOS transistor is at its maximum finite value (off being equivalent to infinite resistance). At a second threshold voltage above the supply voltage, the MOS transistor turns off completely ("fully-off"). When the MOS transistor is in the fully-off condition, there is a third threshold voltage between the first and second threshold voltages for which, when the driver output voltage falls below the third threshold, the MOS transistor switches back to the resistive condition where the resistance is again dependent on the driver output voltage.

The present invention solves the problem of supply back drive by making the resistance of the MOS device, while in the resistive condition, a design parameter. While the MOS transistor is in the positive current mode, the invention solves the problem of threshold voltage accuracy in the active rectifier by the use of progressive turn off and high ON resistance in the reverse current mode prior to the turn off threshold voltage. The invention solves the problem of driver output droop and "chatter" for any load because in the progressive turn off mode the MOS device resistance varies to compensate the load at a finite driver output voltage. If the driver output is open (infinite load resistance), the driver output voltage is equal to the supply voltage. The MOS device resistance does not become infinite (fully-off) until the driver output voltage exceeds the supply voltage.

Figure 1:
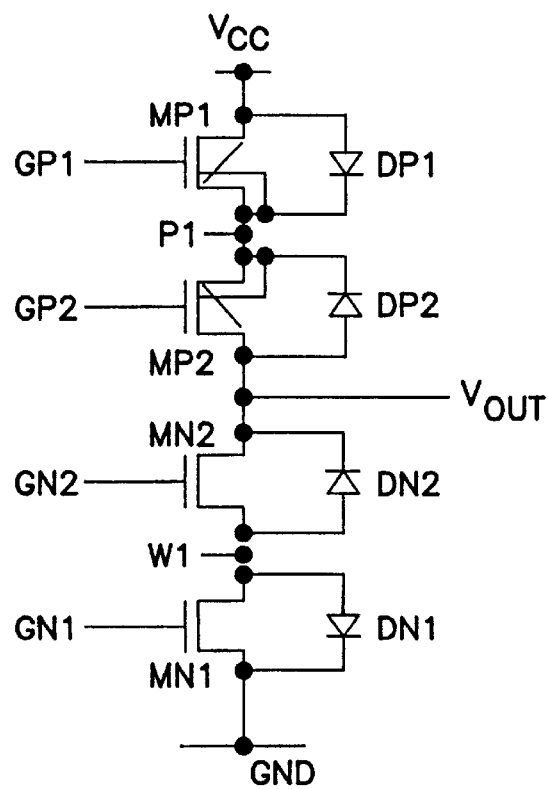
FIG. 1 illustrates a prior art output interface circuit.
Figure 3A:
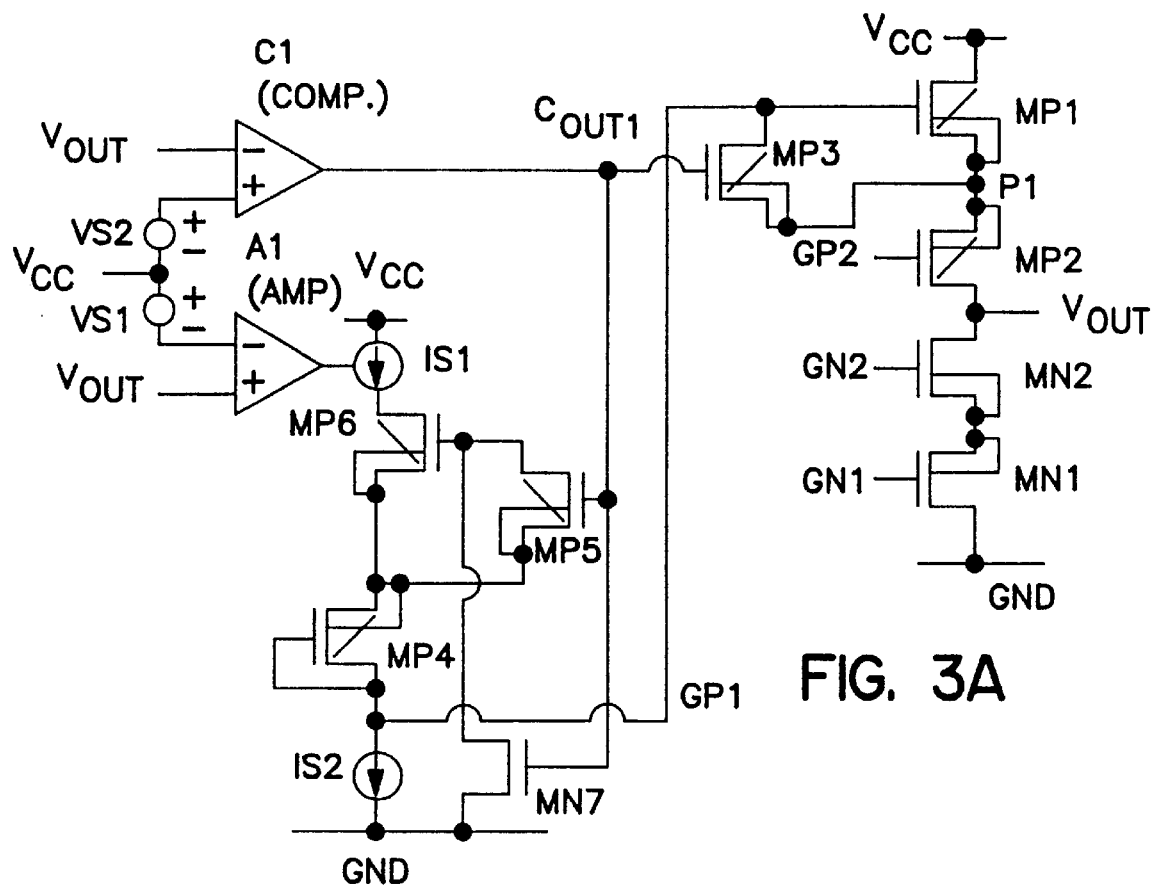
FIG. 3A illustrates a PMOS detection and control circuitry of the present invention.
Figure 3B:
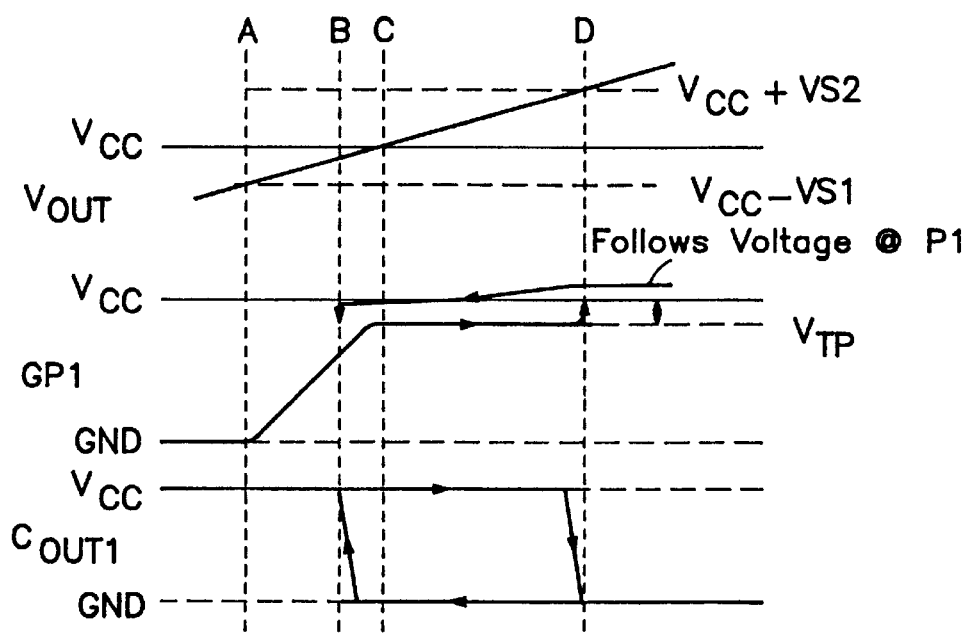
FIG. 3B illustrates various signals of the circuitry in FIG. 3A.

FIG. 3A illustrates a PMOS detection and control circuitry of the present invention while FIG. 3B illustrates various signals of the circuitry in FIG. 3A. The detection and control circuitry is coupled to the driver circuit of FIG. 1 (consisting of devices MP1, MP2, MN1, and MN2) and controls the PMOS side. Referring to FIG. 3A, comparator C1 and amplifier A1 both sense VOUT. Voltage reference VCC−VS1 is coupled to the inverting terminal of A1 and voltage reference VCC+VS2 is coupled to the non-inverting terminal of C1. IS1 is a voltage-controlled current source and IS2 is a fixed current source. The current level of IS1 ranges from 0 to N time IS2 (where N is greater than 1). Both IS1 and IS2 are non-ideal current sources in that positive current will be sourced only when there is a voltage drop across the current source, otherwise the current will be less, but not less than zero.

The operation of the detection and control circuitry is described with VOUT starting from a voltage level well below VCC−VS1 to a voltage level well above VCC+VS2. For sake of clarity, it is assumed that devices MN1 and MN2 remain OFF and that MP2 remains ON. When VOUT is well below VCC−VS1, the output COUT1 of comparator C1 is high, as shown in FIG. 3B. This causes devices MP3 and MP5 to be OFF and device MN7 to be ON. With MN7 ON, the gate of MP6 is pulled low to turn MP6 ON. Moreover, the output of amplifier A1 is low which results in no current at IS1. Device MP4 is diode-connected and always conducts with a forward drop of Vds or Vtp (i.e., the PMOS threshold) which is dependent on the strength (size) of the MOS device and the drain current Id. Since IS2 is a fixed current source and IS1 is providing no current, the gate voltage GP1 is at GND, resulting in MP1 being "fully-on".

When VOUT is in the region between VCC−VS1 and VCC (between points A & C in FIG. 3B), the current source IS1 conducts linearly as VOUT approaches VCC. Devices MP3 and MP5 remain OFF while devices MN7 and MP6 remain ON. As the current level of IS1 approaches and exceeds that of IS2, the gate voltage GP1 of MP1 rises rapidly. As the voltage on Node GP1 rises, it will approach the PMOS gate threshold which begins to turn OFF MP1, limiting the current to pull VOUT up. If there is nothing external pulling up on VOUT, a stable point is reached where VOUT ceases to rise and the gate voltage GP1 is held steady. If there is no external load (to GND) on VOUT, then VOUT will be pulled to VCC. If there is a load, VOUT will settle to a voltage near VCC where the current through the load is balanced by the current through MP1. If there is an external driver pulling VOUT above VCC, reverse current will begin to flow although restricted by the near-threshold gate drive of MP1.

Figure 2:
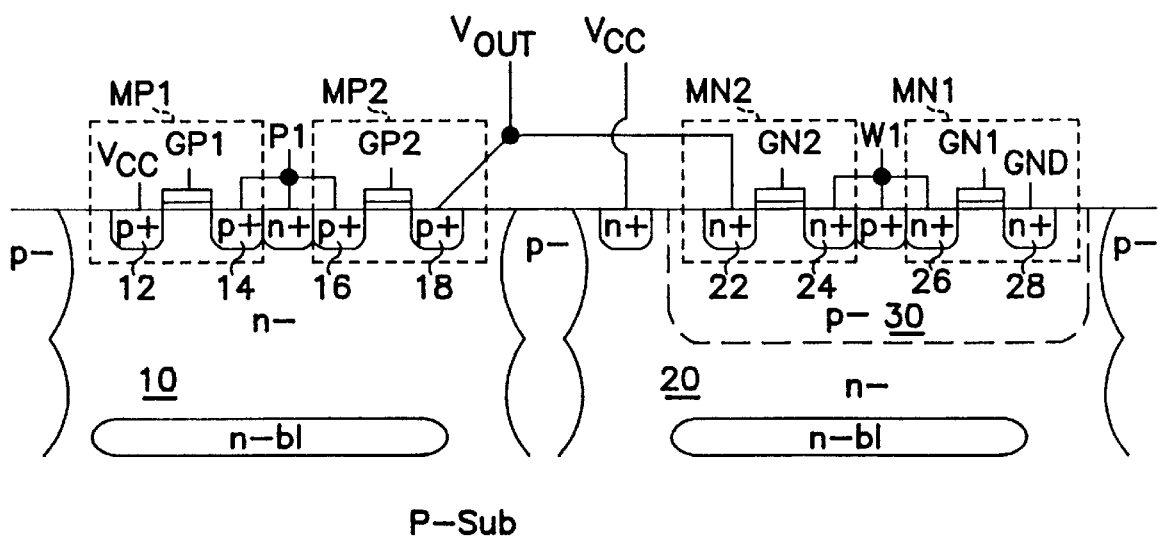
FIG. 2 illustrates a cross section of the prior art output interface circuit.

When VOUT is between VCC and VCC+VS2 (between points C & D in FIG. 3B), the voltage on Node GP1 is held steady and COUT1 remains high. When VOUT exceeds VCC+VS2 (beyond point D in FIG. 3B), the comparator C1 switches and COUT1 goes low to turn ON MP3. With MP3 turned ON, Node GP1 is tied to Node P1 to completely turn OFF MP1. Moreover, with COUT1 low, device MN7 turns OFF while device MP5 turns ON. With MP5 ON, device MP6 turns OFF, but the fixed current source IS2 remains ON. Devices MP4, MP5, and MP6 are co-located in an isolated n- pocket in the same manner as MP1 and MP2 (referring to FIGS. 1 and 2). The body diode of MP6 is reverse biased when GP1 is greater than VCC, thus preventing reverse current through MP6 when OFF. With MP1 and MP6 OFF, the voltage on Node GP1 follows the voltage on Node P1, which in turn follows VOUT, and the only remaining current flow is through IS2 to GND.

In the preceding discussion, it has been assumed that GP2 is ON. In the forward current condition, this allows forward current to pass through MP1. In the reverse condition, this allows the voltage on Node P1 to follow VOUT with virtually no voltage differential. If MP2 were OFF, it would prevent forward current, and in the reverse current condition the voltage on Node P1 follows VOUT but with a voltage drop of one diode (Vbe), thus delaying the switch of comparator C1 until VOUT=VCC+VS2+Vbe.

The description above discusses the functional behavior of the circuit in response to VOUT. The following description discusses the parametric performance that allows a designer to tailor the detection and control circuit to meet specific requirements. In the above discussion it was shown that there is a region where VOUT (and the voltage on Node P1) lies between VCC and VCC+VS2. In this region, MP1 is ON with a gate voltage near the PMOS threshold. This condition allows a restricted reverse current to flow. Of primary importance is the ability to establish the maximum level of the reverse current in MP1. The method for doing this is to use the diode connected device MP4 and the fixed current source IS2 to form an approximation of a scaled current-mirror to MP1. This is an approximation predominately because the operating points of the two MOS devices MP1 and MP4 are quite different.

With the gate-to-drain connection, MP4 is at the edge of saturation, with a Vds equal to the PMOS threshold (Vtp), at the IS2 current level. MP1 has a very low Vds with nearly the same gate-to-source (Vgs) voltage as MP4, and is in the triode region. Of second order of importance is that the source of MP4 is in series with IS1 and MP6 to VCC. Both have a small but non zero voltage drop which subtracts from the effective Vgs of MP4. As VOUT and the voltage on Node P1 rise above VCC, this adds to the effective Vgs of MP1. Additionally, there are differing body-effects offsetting the thresholds of each MOS device. The net result is that while the ability to mirror MP1 is not perfect it is adequate as a means for creating operating limits to the MP1 reverse current. By varying the size (strength) of MP4 relative to the size of MP1, and the current level of IS2, the maximum reverse current may be set. The voltage sources VS1 and VS2 equate to built-in offsets in A1 and C1, respectively, and provide a means for adjusting the functional switch points. These switch points provide a buffer region about the reverse bias point, and eliminate the need for precision in voltage or current detection.

For completeness, it is useful to examine the behavior of the circuit as VOUT is traversed from a voltage level greater than VCC+VS2 to a voltage level less than VCC-VS1, assuming MP2 is ON. The comparator C1 has hysteresis such that the reference for a rising input is above VCC and for a falling input is below VCC. As VOUT falls (between points D & B in FIG. 3B), the circuit does not change states and MP1 remains off until VOUT and the voltage on Node P1 are less than VCC, but greater than VCC-VS1. Once VOUT falls below the C1 threshold (to the left of point B), COUT1 goes high and the voltage on Node GP1 drops to its linear range to turn on MP1 with restricted current flow. Device MP5 turns OFF and devices MN7 and MP6 turn ON. As VOUT approaches VCC-VS1, the voltage on Node GP1 continues to drop, and once it passes below VCC-VS1, the voltage on Node GP1 is at GND and MP1 is "fully-on".

Figure 4A:
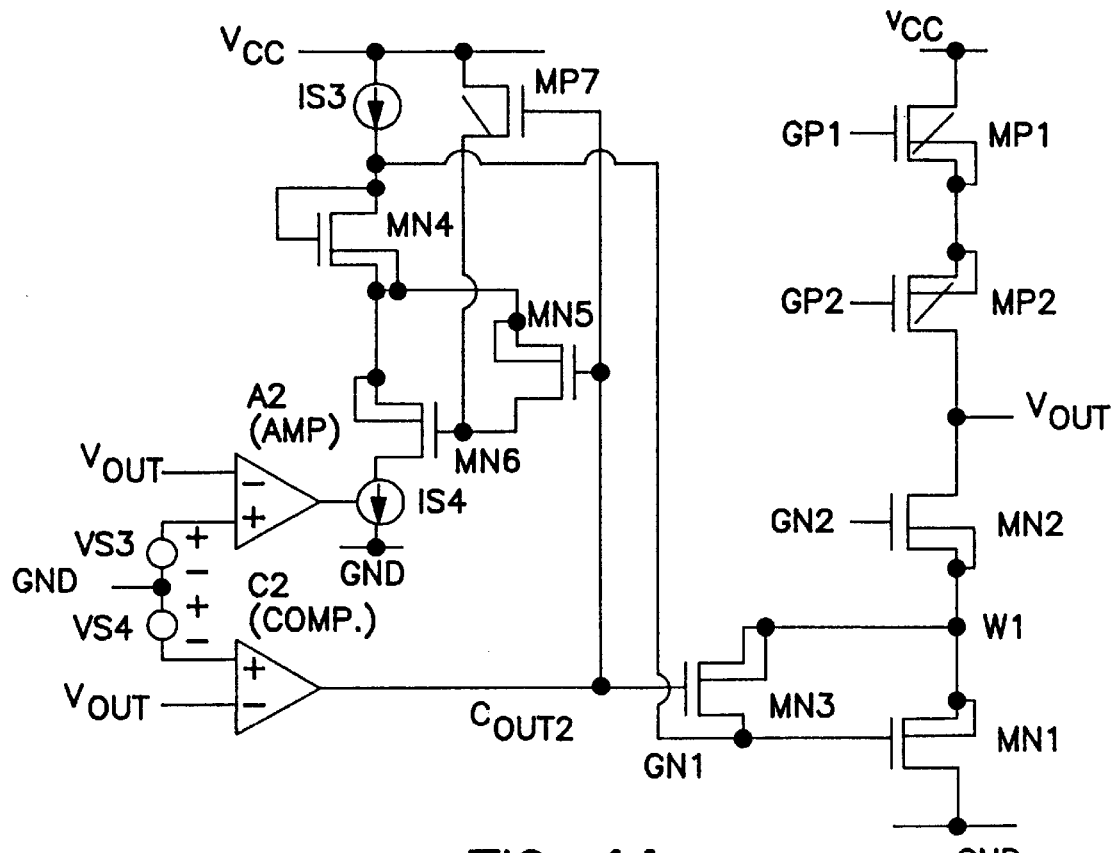
FIG. 4A illustrates a NMOS detection and control circuitry of the present invention.
Figure 4B:
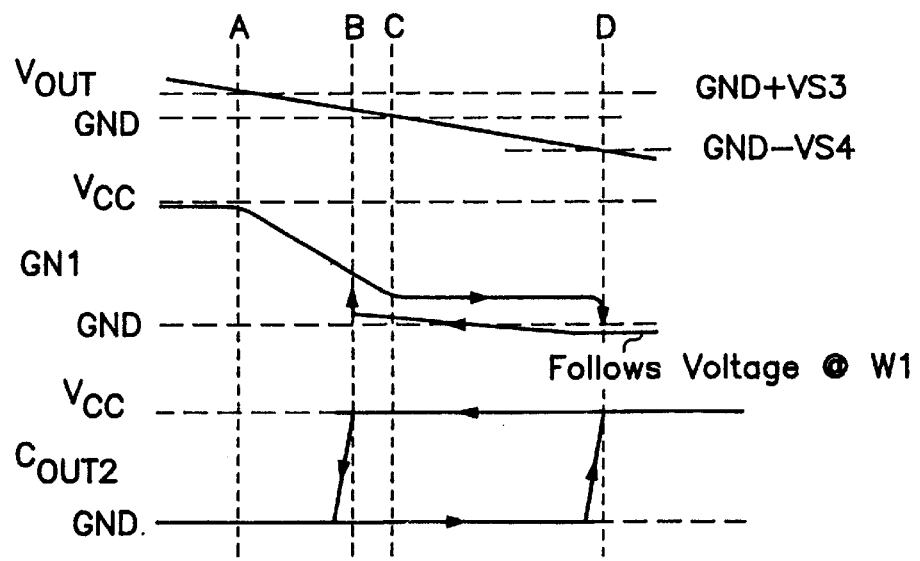
FIG. 4B illustrates various signals of the circuitry in FIG. 4A.

FIG. 4A illustrates a NMOS detection and control circuitry of the present invention while FIG. 4B illustrates various signals of the circuitry in FIG. 4A. Referring to FIG. 4A, VOUT is coupled to the inverting terminals of the comparator C2 and Amplifier A2. Voltage references GND+VS3 and GND-VS4 are coupled to the non-inverting terminals of A2 and C2, respectively. IS4 is a voltage-controlled current source while IS3 is a fixed current source. The current level of IS4 ranges from 0 to N time IS3 (where N is greater than 1). Both IS3 and IS4 are non-ideal current sources in that positive current will be sourced only when there is a voltage drop across the current source, otherwise the current will be less, but not less than zero.

The operation of the detection and control circuitry is described with VOUT starting from a voltage level well above GND+VS3 to a voltage level well below GND-VS4. For sake of clarity, it is assumed that devices MP1 and MP2 remain OFF and that MN2 remains ON. When VOUT is well above GND+VS3, the output COUT2 of comparator C2 is low, as shown in FIG. 4B. This causes devices MN3 and MN5 to be OFF and device MP7 to be ON. With MP7 ON, the gate of MN6 is pulled high to turn MN6 ON. Moreover, the output of amplifier A2 is low which results in no current at IS4. Device MN4 is diode-connected and always conducts with a forward drop of Vds or Vtp (i.e., the NMOS threshold) which is dependent on the strength (size) of the MOS device and the drain current Id. Since IS3 is a fixed current source and IS4 is providing no current, the gate voltage GN1 is at VCC, resulting in MN1 being "fully-on".

When VOUT is in the region between GND+VS3 and GND (between points A & C in FIG. 4B), the current source IS4 conducts linearly as VOUT approaches GND. Devices MN3 and MN5 remain OFF while devices MP7 and MN6 remain ON. As the current level of IS4 approaches and exceeds that of IS3, the gate voltage GN1 of MN1 falls rapidly. As the voltage on Node GN1 falls, it will approach the NMOS gate threshold which begins to turn OFF MN1, limiting the current to pull VOUT down. If there is nothing external pulling down on VOUT, a stable point is reached where VOUT ceases to fall and the gate voltage GN1 is held steady. If there is no external load (to VCC) on VOUT, then VOUT will be pulled to GND. If there is a load, VOUT will settle to a voltage near GND where the current through the load is balanced by the current through MN1. If there is an external driver pulling VOUT below GND, reverse current will begin to flow although restricted by the near-threshold gate drive of MN1.

When VOUT is between GND and GND-VS4 (between points C & D in FIG. 4B), the voltage on Node GN1 is held steady and COUT2 remains low. When VOUT falls below GND-VS4 (beyond point D in FIG. 4B), the comparator C2 switches and COUT2 goes high to turn ON MN3. With MN3 turned ON, Node GN1 is tied to Node W1 to completely turn OFF MN1. Moreover, with COUT2 high, device MP7 turns OFF while device MN5 turns ON. With MN5 ON, device MN6 turns OFF, but the fixed current source IS3 remains ON. Devices MN4, MN5, and MN6 are co-located in an isolated P-well in the same manner as MN1 and MN2 (referring to FIGS. 1 and 2). The body diode of MN6 is reverse biased when GN1 is less than GND, thus preventing reverse current through MN6 when OFF. With MN1 and MN6 OFF, the voltage on Node GN1 follows the voltage on Node W1, which in turn follows VOUT, and the only remaining current flow is through IS3 from VCC.

In the preceding discussion, it has been assumed that GN2 is ON. In the forward current condition, this allows forward current to pass through MN1. In the reverse condition, this allows the voltage on Node W1 to follow VOUT with virtually no voltage differential. If MN2 were OFF, it would prevent forward current, and in the reverse current condition the voltage on Node W1 follows VOUT but with a voltage drop of one diode (Vbe), thus delaying the switch of comparator C2 until VOUT=GND-VS4-Vbe.

VOUT is now traversed from a voltage level below GND-VS4 to a voltage level greater than GND+VS3, assuming MN2 is ON. The comparator C2 has hysteresis such that the reference for a falling input is below GND and for a rising input is above GND. As VOUT rises (between points D & B in FIG. 3B), the circuit does not change states and MN1 remains off until VOUT and the voltage on Node W1 are greater than GND, but less than GND+VS3. Once VOUT rises above the C2 threshold (to the left of point B), COUT2 goes low and the voltage on Node GN1 rises to its linear range to turn on MN1 with restricted current flow. Device MN5 turns OFF and devices MP7 and MN6 turn ON. As VOUT approaches GND+VS3, the voltage on Node GN1 continues to drop, and once it passes above GND+VS3, the voltage on Node GN1 is at VCC and MN1 is "fully-on".

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit coupled to an output transistor of a first conductivity type including a gate, a drain coupled to a power supply terminal having a rail voltage thereon, and a source coupled to an output terminal having an output voltage thereon, the circuit to ensure current flow in one direction and to throttle current flow in a reverse direction, comprising:
    a first circuit coupled to the gate of the output transistor to progressively turn off the output transistor as the output voltage reaches a first threshold voltage and approaches the rail voltage; and
    a second circuit coupled to the gate and source of the output transistor to turn off the output transistor as the output voltage reaches a second threshold voltage, the second threshold voltage being greater than the rail voltage.

2. The circuit of claim 1 wherein the output transistor is a P-channel metal-oxide semiconductor transistor.

3. The circuit of claim 1 wherein the first circuit progressively turns off the output transistor such that the electrical resistance of the output transistor increases in inverse proportion to the difference between the output voltage and the rail voltage as the output voltage approaches the rail voltage.

4. The circuit of claim 1 wherein the first circuit comprises:
    a transistor of the first conductivity type having a gate, a source coupled to the power supply terminal, and a drain, the gate and drain being coupled to the gate of the output transistor; and
    a current source coupled to the drain of the transistor;
    wherein when the output voltage rises between the rail voltage and the second threshold voltage, a maximum current in the reverse direction is a function of the size of the transistor and the current level of the current source.

5. The circuit of claim 1 wherein the first circuit comprises:
    an amplifier having a non-inverting terminal with the output voltage applied thereto and an inverting terminal with the first threshold voltage applied thereto;
    a voltage-controlled current source coupled to an output of the amplifier and to the power supply terminal; and
    a diode connected transistor coupled to the voltage-controlled current source.

6. The circuit of claim 5 wherein the diode connected transistor comprises:
    a transistor of the first conductivity type having a gate, a source coupled to the voltage-controlled current source, and a drain coupled to the gates of the transistor and the output transistor; and
    a second current source having a first terminal coupled to the drain of the transistor and the gate of the output transistor and a second terminal coupled to a second power supply terminal.

7. The circuit of claim 6 wherein the voltage-controlled current source has a current level ranging from 0 to N times the second current source current level, where N is greater than one.

8. The circuit of claim 1 wherein the first circuit comprises:
    an amplifier having a non-inverting terminal with the output voltage applied thereto and an inverting terminal with the first threshold voltage applied thereto;
    a voltage-controlled current source coupled to an output of the amplifier and to the power supply terminal;
    a transistor of the first conductivity type having a gate, a source coupled to the voltage-controlled current source, and a drain coupled to the gates of the transistor and the output transistor; and
    a second current source having a first terminal coupled to the drain of the transistor and to the gate of the output transistor and a second terminal coupled to a second power supply terminal.

9. The circuit of claim 1 wherein the second circuit comprises:
    a comparator having a non-inverting terminal with the second threshold voltage applied thereto and an inverting terminal with the output voltage applied thereto; and
    a transistor coupled to the comparator and the output transistor, said transistor to turn off the output transistor when the output voltage is substantially the same as the second threshold voltage.

10. The circuit of claim 1 wherein the second circuit comprises:
    a comparator having a non-inverting terminal with the second threshold voltage applied thereto and an inverting terminal with the output voltage being applied thereto; and
    a transistor of the first conductivity type having a gate, a drain, and a source, the gate being coupled to an output of the comparator, and the drain and source being coupled to the gate and source of the output transistor, respectively, said transistor couples the gate and source of the output transistor to turn off the same when the output voltage is substantially the same as the second threshold voltage.

11. The circuit of claim 8 wherein the second circuit comprises:
    a comparator having a non-inverting terminal with the second threshold voltage applied thereto and an inverting terminal with the output voltage applied thereto; and
    a second transistor coupled to the comparator and the output transistor, said second transistor to turn off the output transistor when the output voltage is substantially the same as the second threshold voltage.

12. The circuit of claim 11 further comprising a third circuit coupled to the first and second circuits to enable the first circuit when the output voltage is less than the second threshold voltage.

13. The circuit of claim 12 wherein the third circuit comprises:
   a third transistor of the first conductivity type having a gate, a drain coupled to the voltage-controlled current source, and a source coupled to the source of the first transistor;
   a fourth transistor of the first conductivity type having a gate coupled to the output of the comparator, a drain coupled to the gate of the third transistor, and a source coupled to the source of the first transistor; and
   a fifth transistor of a second conductivity type having a gate coupled to the gate of the fourth transistor, a drain coupled to the gate of the third transistor, and a source coupled to the second power supply terminal.

14. The circuit of claim 13 wherein when the output voltage is substantially the same as or greater than the second threshold voltage, the third transistor turns off to block reverse current flow through the voltage-controlled current source and to the rail voltage.

15. The circuit of claim 13 wherein transistors of the first conductivity type are P-channel metal-oxide semiconductor transistors and transistors of the second conductivity type are N-channel metal-oxide semiconductor transistors.

16. A circuit coupled to an output transistor of a first conductivity type including a gate, a drain coupled to a power supply terminal having a rail voltage thereon, and a source coupled to an output terminal having an output voltage thereon, the circuit to ensure current flow in one direction and to throttle current flow in a reverse direction, comprising:
   a first circuit coupled to the gate of the output transistor to progressively turn off the output transistor as the output voltage reaches a first threshold voltage and approaches the rail voltage; and
   a second circuit coupled to the gate and source of the output transistor to turn off the output transistor as the output voltage reaches a second threshold voltage, the second threshold voltage being less than the rail voltage.

17. The circuit of claim 16 wherein the output transistor is a N-channel metal-oxide semiconductor transistor.

18. The circuit of claim 16 wherein the first circuit progressively turns off the output transistor such that the electrical resistance of the output transistor increases in inverse proportion to the difference between the output voltage and the rail voltage as the output voltage approaches the rail voltage.

19. The circuit of claim 16 wherein the first circuit comprises:
   a transistor of the first conductivity type having a gate, a source coupled to the power supply terminal, and a drain, the gate and drain being coupled to the gate of the output transistor; and
   a current source coupled to the drain of the transistor;
   wherein when the output voltage falls between the rail voltage and the second threshold voltage, a maximum current in the reverse direction is a function of the size of the transistor and the current level of the current source.

20. The circuit of claim 16 wherein the first circuit comprises:
   an amplifier having a non-inverting terminal with the first threshold voltage applied thereto and an inverting terminal with the output voltage applied thereto;
   a voltage-controlled current source coupled to an output of the amplifier and to the power supply terminal; and
   a diode connected transistor coupled to the voltage-controlled current source.

21. The circuit of claim 20 wherein the diode connected transistor comprises:
   a transistor of the first conductivity type having a gate, a source coupled to the voltage-controlled current source, and a drain coupled to the gates of the transistor and the output transistor; and
   a second current source having a first terminal coupled to the drain of the transistor and the gate of the output transistor and a second terminal coupled to a second power supply terminal.

22. The circuit of claim 21 wherein the voltage-controlled current source has a current level ranging from 0 to N times the second current source current level, where N is greater than one.

23. The circuit of claim 16 wherein the first circuit comprises:
   an amplifier having a non-inverting terminal with the first threshold voltage applied thereto and an inverting terminal with the output voltage applied thereto;
   a voltage-controlled current source coupled to an output of the amplifier and to the power supply terminal;
   a transistor of the first conductivity type having a gate, a source coupled to the voltage-controlled current source, and a drain coupled to the gates of the transistor and the output transistor; and
   a second current source having a first terminal coupled to the drain of the transistor and to the gate of the output transistor and a second terminal coupled to a second power supply terminal.

24. The circuit of claim 16 wherein the second circuit comprises:
   a comparator having a non-inverting terminal with the second threshold voltage applied thereto and an inverting terminal with the output voltage applied thereto; and
   a transistor coupled to the comparator and the output transistor, said transistor to turn off the output transistor when the output voltage is substantially the same as the second threshold voltage.

25. The circuit of claim 16 wherein the second circuit comprises:
   a comparator having a non-inverting terminal with the second threshold voltage applied thereto and an inverting terminal with the output voltage being applied thereto; and
   a transistor of the first conductivity type having a gate, a drain, and a source, the gate being coupled to an output of the comparator, and the drain and source being coupled to the gate and source of the output transistor, respectively, said transistor couples the gate and source of the output transistor to turn off the output transistor when the output voltage is substantially the same as the second threshold voltage.

26. The circuit of claim 23 wherein the second circuit comprises:
   a comparator having a non-inverting terminal with the second threshold voltage applied thereto and an inverting terminal with the output voltage applied thereto; and
   a second transistor coupled to the comparator and the output transistor, said second transistor to turn off the output transistor when the output voltage is substantially the same as the second threshold voltage.

27. The circuit of claim 26 further comprising a third circuit coupled to the first and second circuits to enable the first circuit when the output voltage is greater than the second threshold voltage.

28. The circuit of claim 27 wherein the third circuit comprises:
   a third transistor of the first conductivity type having a gate, a drain coupled to the voltage-controlled current source, and a source coupled to the source of the first transistor;
   a fourth transistor of the first conductivity type having a gate coupled to the output of the comparator, a drain coupled to the gate of the third transistor, and a source coupled to the source of the first transistor; and
   a fifth transistor of a second conductivity type having a gate coupled to the gate of the fourth transistor, a drain coupled to the gate of the third transistor, and a source coupled to the second power supply terminal.

29. The circuit of claim 28 wherein when the output voltage is substantially the same as or less than the second threshold voltage, the third transistor turns off to block reverse current flow from the rail voltage and through the voltage-controlled current source.

30. The circuit of claim 28 wherein transistors of the first conductivity type are N-channel metal-oxide semiconductor transistors and transistors of the second conductivity type are P-channel metal-oxide semiconductor transistors.

31. A method of ensuring current flow in one direction and throttling current flow in a reverse direction in an output transistor having a gate, a drain coupled to a power supply terminal having a rail voltage thereon, and a source coupled to an output terminal having an output voltage thereon, comprising:
   turning off the output transistor progressively as the output voltage reaches the first threshold voltage and approaches the rail voltage such that an electrical resistance of the output transistor increases in inverse proportion to the difference between the output voltage and the rail voltage as the output voltage approaches the rail voltage; and
   turning off the output transistor as the output voltage reaches a second threshold voltage, wherein the rail voltage is at a voltage between the first threshold voltage and the second threshold voltage.

* * * * *